(12) United States Patent
Hart et al.

(10) Patent No.: US 7,266,161 B1
(45) Date of Patent: Sep. 4, 2007

(54) EFFICIENT METHOD AND APPARATUS FOR PARALLEL PROCESSING FOR USE WITH HIGH-SPEED SINGLE-BIT SAMPLING

(75) Inventors: Billy D. Hart, Cedar Rapids, IA (US); Steven L. White, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 778 days.

(21) Appl. No.: 10/606,724

(22) Filed: Jun. 26, 2003

(51) Int. Cl.
*H03D 3/00* (2006.01)
(52) U.S. Cl. ..................................... 375/322
(58) Field of Classification Search ............... 375/316, 375/322, 324, 340
See application file for complete search history.

(56) References Cited

U.S. PATENT DOCUMENTS 6,442,216 B1* 8/2002 McLaughlin et al. ....... 375/322
6,449,244 B1* 9/2002 Loseke ....................... 370/208
7,079,061 B2* 7/2006 Schuurmans ................ 341/143
2003/0005008 A1* 1/2003 Gray ........................... 708/300

* cited by examiner

*Primary Examiner*—Kevin Burd
(74) *Attorney, Agent, or Firm*—Nathan O. Jensen; Kyle Eppele (57) ABSTRACT

An apparatus and method provides efficient parallel processing for use with a single-bit sampler that provides single-bit samples at a high sample rate. A serial-to-parallel converter converts the single-bit samples into parallel single-bit samples at a reduced sample rate. A digital quadrature mix performs a frequency shift to the parallel single-bit samples and simultaneously performs a real-to-complex conversion of the parallel single-bit samples from the serial-to-parallel converter to provide parallel I and Q output values at an intermediate frequency. The serial-to-parallel converter has shift register stages that provide a memory for use in functional realization of a boxcar filter and decimation-by-two in the digital quadrature mix. The digital quadrature mix utilizes logic to route and invert the parallel single-bit samples resulting in the parallel I and Q single-bit output values. Additional filter and decimate stages may be used to process the parallel I and Q single-bit output values.

8 Claims, 7 Drawing Sheets

EFFICIENT METHOD AND APPARATUS FOR PARALLEL PROCESSING FOR USE WITH HIGH-SPEED SINGLE-BIT SAMPLING

GOVERNMENT RIGHTS

This invention was made with Government support under Contract No. DAAB07-96-C-A760 awarded by US Army CECOM. The Government may have certain rights in the invention.

BACKGROUND OF THE INVENTION

This invention relates to communications systems, digital signal processing, and specifically to a method and apparatus for efficient parallel processing for use with high-speed single-bit sampling in a communications system.

Communications systems are utilizing digital signal processing to perform applications previously done with analog circuitry. Digital signal processing offers increased performance with reduced size, power consumption, and cost. Digital signal processing is used to perform digital modulation, demodulation, filtering, and other functions in communications system receivers and transmitters.

High-speed sampling and frequency shifting from an IF (intermediate frequency) are some of the more challenging aspects of a digital demodulator used in communications system equipment. The problem is made simpler if single-bit sampling can be used. Even when this is possible, filtering and moving the samples into the demodulator in real time is a formidable problem because of the very high speed sampling rates.

What is needed are more hardware efficient methods for performing quadrature mixing, filtering, decimating, and moving high-speed single-bit samples from an A-to-D converter or some similar digitizing device into the digital demodulator in real time.

SUMMARY OF THE INVENTION

A method and apparatus for efficiently performing the combined operations of quadrature mixing, filtering, and decimation on single-bit samples using efficient parallel processing algorithms and apparatus are disclosed. A single-bit sampler converts an analog signal into serial single-bit samples at a high sample rate. A serial-to-parallel converter converts the single-bit samples from the single-bit sampler into parallel single-bit samples.

A digital quadrature mix performs real-to-complex conversion, filtering, and decimation-by-two of the parallel single-bit samples from the serial-to-parallel converter and provides parallel in-phase (I) and quadrature (Q) output values. The digital quadrature mix performs an Fs/4 mix where Fs is the sample rate. The digital quadrature mix comprises logic operations that route and invert the parallel single-bit samples resulting in the parallel I and Q single-bit output values. A decimate-by-two is performed by producing half as many complex output values as there are real-valued inputs.

A filter and decimate stage may be used to further filter and decimate the parallel I and Q single-bit output values. The filter and decimate stage comprises a boxcar decimation filter having a plurality of filter and decimate-by-two functions. Each of the plurality of filter and decimate-by-two functions comprise a NOR gate having two inputs connected to outputs of the digital quadrature mix and an exclusive NOR gate having two inputs connected to the two inputs of the NOR gate.

It is an object of the present invention to provide a method and apparatus for efficiently performing real-to-complex conversion, frequency translation or mixing, decimation filtering, and data movement functions on very high-speed single-bit samples.

It is an object of the present invention to provide a method and apparatus of single-bit parallel processing for use with single-bit or hard-limited sampling.

It is an advantage of the present invention to be able to implement the method and apparatus in hardware in applications where power and size may be at a premium.

It is an advantage of the present invention to provide a method and apparatus for use where the sampling rate is so high that it would be impractical to process the samples serially in real time.

It is a feature of the present invention to provide mixing, filtering, and decimation for high-speed parallel processing using simple hardware logic functions.

It is a feature of the present invention to utilize memory inherit in serial-to-parallel conversion to realize filter and decimate functions.

BRIEF DESCRIPTION OF THE DRAWINGS

The invention may be more fully understood by reading the following description of the preferred embodiments of the invention in conjunction with the appended drawings wherein.

DETAILED DESCRIPTION

The present invention is for a method and apparatus for efficiently performing real-to-complex conversion, frequency translation or mixing, decimation filtering, and data movement functions on high-speed single-bit samples used in radio communications equipment and other applications. This method and apparatus is particularly useful for implementation in hardware where power and size may be at a premium. The present invention is of particular interest for use with single-bit sampling. Single-bit sampling, utilizing hard-limited sampling or analog-to-digital conversion (ADC), is used because of hardware simplicity, minimal power requirements, and no automatic gain control (AGC) requirement. The sampled data from a single-bit ADC must typically be converted to complex form, low-pass filtered, and then decimated in order to bring the sampling rate down to a practical rate for subsequent processing.

Figure 1:
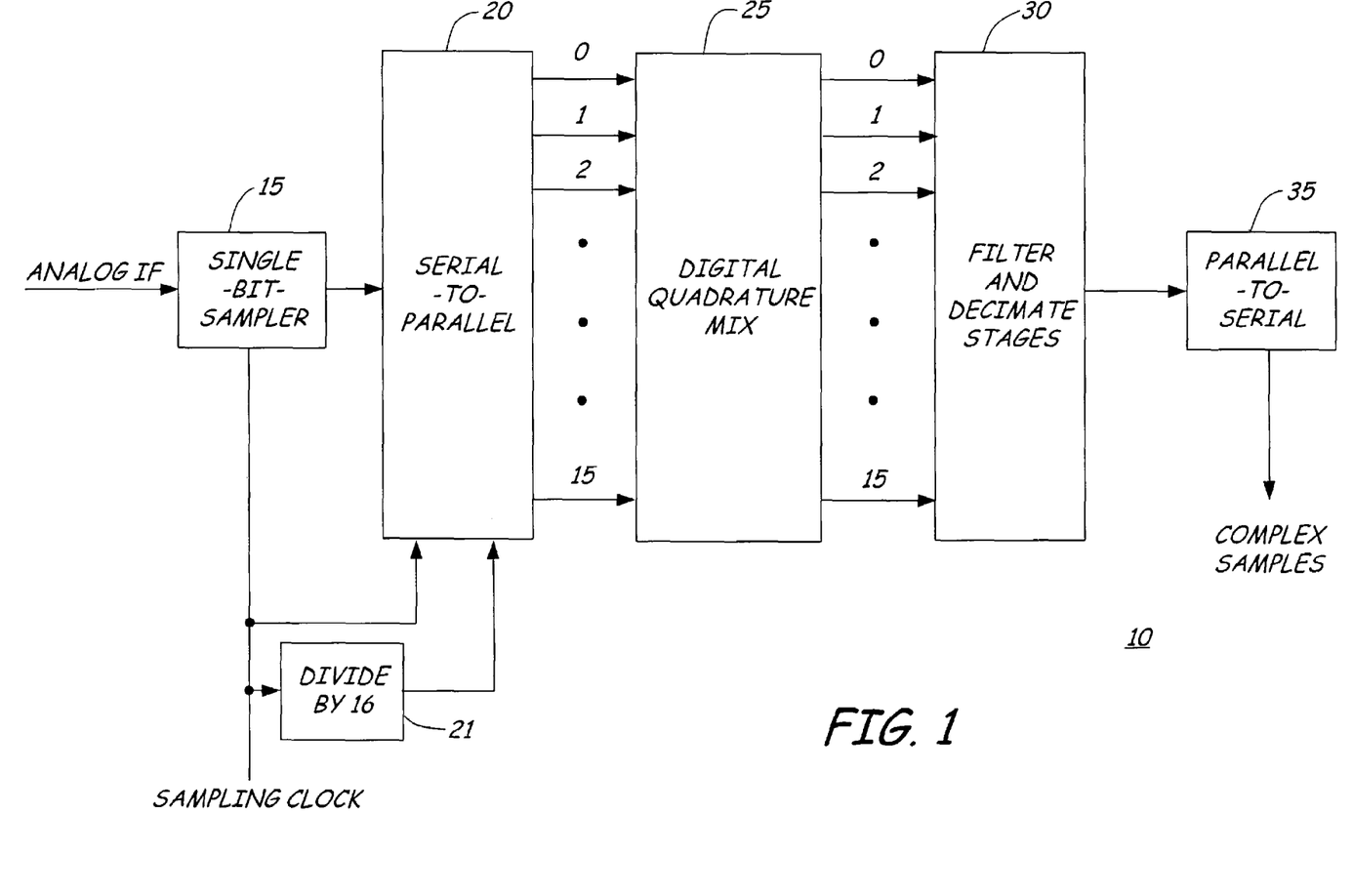
FIG. 1 is a block diagram of a conceptual high-speed single-bit sampling system of the present invention.

FIG. 1 is a block diagram of a conceptual high-speed single-bit sampling system 10 of the present invention. The example shown assumes a 1-to-16 parallelization. Other ratios are possible and 1-to-16 is used herein for illustration of the technique. An analog IF (intermediate frequency) input signal from a receiver RF translator (not shown) or other signal source is provided to a single-bit sampler 15 that may be a single-bit ADC, known in the art. A hard-limited sampler may be used and it converts an analog signal to two states. The hard limited sampler provides a logic 1 when the analog signal is positive and a logic 0 when the analog signal is negative. A sampled data output signal from the single-bit sampler 15 is merely a series of single bits at a sample clock rate.

The high-speed sampled data output signal serial bit stream is converted to a parallel stream of bits in a serial-in-to-parallel out (SIPO) converter 20 in FIG. 1. This is done to reduce the clock speed of the data for down-stream processing. FIG. 1 shows the example of a 1:16 SIPO converter 20 that reduces the data rate by 16, but any ratio can be used depending on system requirements. This description will adhere to the 1:16 ratio as an example. The SIPO converter 20 is known in the art and may be a shift register comprising a number of stages, 16 in this example, clocked by the sample clock divided by 16 in block 21.

With the clock rate of the sampled data signal reduced by SIPO converter 20, the next step is to convert the real samples into baseband complex samples in digital quadrature mix 25. The digital quadrature mix 25 is discussed in more detail in conjunction with FIG. 3.

After conversion of the real samples into complex samples in digital quadrature mix 25, the complex samples are then low-pass filtered and decimated in order to bring the sample rate down for subsequent processing. Decimation is accomplished in filter and decimate stages 30 in FIG. 1. The decimation ratio depends on the bandwidth of the signal and other factors. The decimation process is discussed in conjunction with FIGS. 6, 7, and 8.

Finally, after real-to-complex conversion and decimation, the complex samples may be re-serialized in parallel-to-serial converter 35 for subsequent processing using conventional serial processing methods. The re-serialization step may not be necessary depending on whether or not parallel processing techniques are used in the downstream processing.

Figure 2:
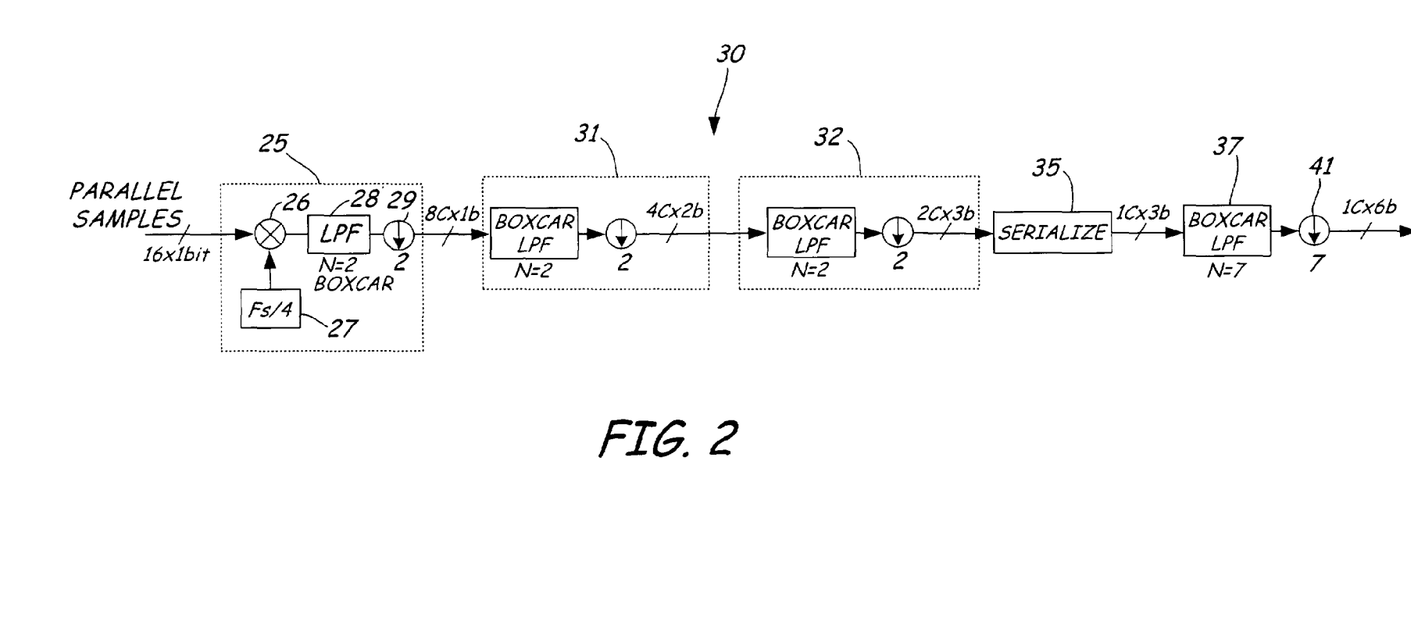
FIG. 2 is a functional block diagram of an example sampling system illustrating in greater detail features shown in FIG. 1.

FIG. 2 is a functional block diagram of an example sampling system illustrating in greater detail features described in conjunction with FIG. 1. The block diagram shows the following sequence of processing: digital quadrature mix (DQM) 25; filter and decimate stages 30 comprising a first low-pass filter and decimate-by-two 31 and a second low-pass filter and decimate-by-two 32; parallel-to-serial conversion (PISO) 35; and a serial boxcar low-pass filter 37 and decimate-by-seven 41. In FIG. 2 signal descriptors are number of signals, real or complex, and resolution. For example 4C×2b indicates four complex signals with two-bit resolution for 16 wires total. Dashed lines around functions indicate a parallel logic implementation. Light solid signal lines represent real samples and heavy solid signal lines represent complex samples.

The numerical values chosen for the example in FIG. 2 do not relate to any particular application, but are chosen as representative of typical values. The numerical values merely serve to demonstrate the type of processing involved in the present invention. All of the processing prior to the parallel-in-serial-out (PISO) function 35 makes use of efficient parallel processing techniques of the present invention. The following paragraphs describe these concepts in more detail.

Figure 3:
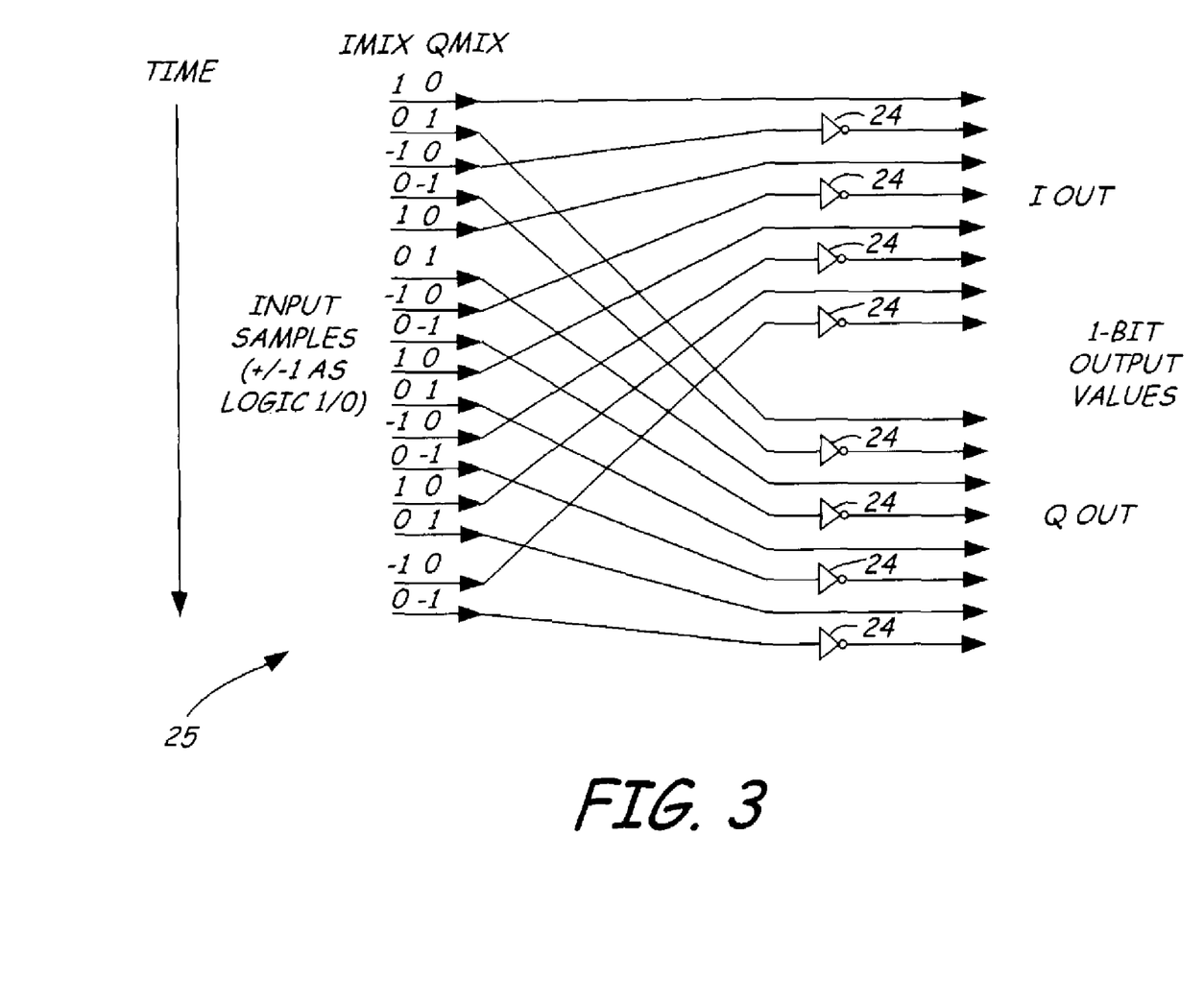
FIG. 3 shows a logic implementation of a quadrature mix, filter, and decimate of the present invention.

The first operation required after sampling in the single-bit sampler 15 and sample rate reduction in serial-to-parallel conversion 20 in FIG. 1 is to convert the real single-bit parallel samples (16×1b) to baseband complex samples (8C×1b). This is most efficiently performed by a parallel implementation of the DQM function 25. The DQM function 25 is shown in FIG. 2 as a quadrature Fs/4 mix as indicated by digital mixer 26 and clock Fs/4 27 followed by a low-pass filter 28 and decimate-by-two 29. Fs is the sample rate of the real parallel single-bit samples from the SIPO converter 20. The DQM 25 simultaneously frequency shifts the incoming samples and converts them to I (in-phase) and Q (quadrature) components. Fs/4 is chosen as the IF frequency in order to make the frequency shifting operation very simple. An IF of Fs/4 allows the quadrature mix to be performed with pure logic operations instead of requiring a NCO (numerically controlled oscillator) for an actual clock 27 as is typically done. FIG. 3 shows the logic operations to implement the DQM functions of Fs/4 mix (mixer 26 and clock 27), low-pass filter 28, and decimate-by-two 29. The parallel samples from SIPO converter 20 are routed through the DQM 25 with half the outputs inverted in inverters 24 resulting in separated I and Q single-bit output values.

A by-product of the parallelized DQM function 25 shown in FIG. 3 is the functional realization of the low-pass filter 28 and decimation by two 29 of the sample rate. The low-pass filter 28 and decimation by two 29 are not actually shown in FIG. 3. The low-pass filter 28 function is equivalent to the conventional serial boxcar filter 37 shown in FIG. 2 and in greater detail in FIG. 4 with a boxcar filter response shown in FIG. 5. The inverters 24 may alternatively be absorbed into preceding or subsequent logic (not shown).

Operation of the DQM 25 shown in FIG. 3 is possible because of the serial-to-parallel operation of the SIPO converter 20. The SIPO converter 20 shifts the serial bit stream through the 16 shift register stages causing a delay that provides a memory or delay function, $Z^{-1}$ 38 in FIG. 4, used in the implementation of a FIR (finite impulse response) digital filter, known in the art, of which the boxcar filter 37 is a special case. Each of the sixteen outputs from the SIPO converter 20 is connected to the sixteen inputs of DQM 25 in FIG. 3. The decimal +1 and −1 input samples are represented by logic 1 and 0. The samples from the SIPO converter 20 are loaded into the DQM 25 vertically from the top to the bottom in time with the first samples out from SIPO converter 20 loaded into the top of DQM 25.

Imix and Qmix above the inputs to the DQM 25 in FIG. 3 indicate how the input samples are divided and routed to the output. The first line on the top shows Imix at 1 and Qmix at 0 indicating that the input samples are routed to the top Iout output. The second input from the top indicates an Imix of 0 and a Qmix of 1 indicating that the input samples are routed to the top Qout output. The third input from the top shows an Imix of −1 and a Qmix of 0. The input samples are routed through an inverter 24 to a second Iout. The remaining input sample lines are routed in the same fashion to provide eight Iout and eight Qout 1-bit output values. This routing and separation of the input samples to the DQM 25 is equivalent to mixing the input samples in two mixers with two injections from an NCO with a 90 degree phase shift in one injection relative to the other.

If the bandwidth of the input signal is much larger than the signal of interest, then low-pass filtering and decimation sections 30 can be used to reduce the sample rate to that commensurate with the signal of interest. An efficient algorithm for performing this operation on parallel samples makes use of parallel boxcar decimation filters 31 and 32 in FIG. 2, also called a finite-time integrator or integrate-and-dump. These filters 31 and 32 are again functionally equivalent to the serial boxcar filter 37 in FIG. 4.

Figure 4:
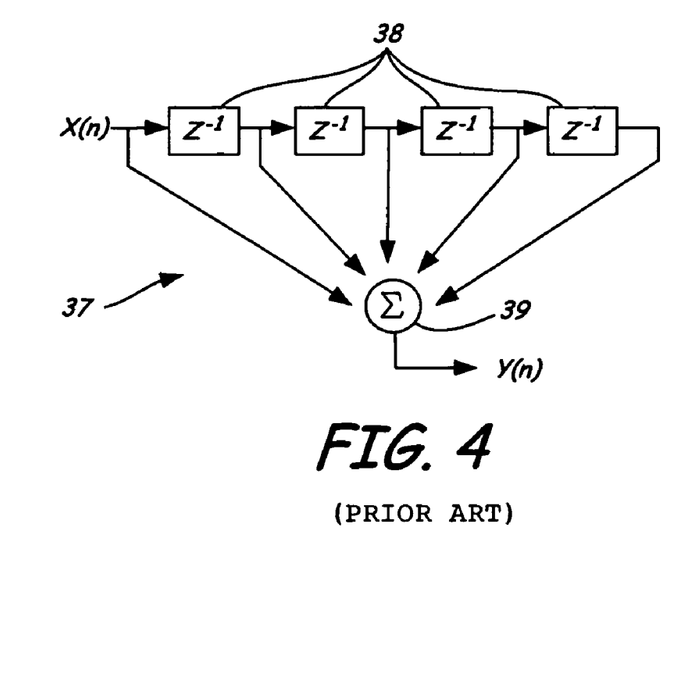
FIG. 4 is a block diagram of a conventional serial boxcar filter.
Figure 5:
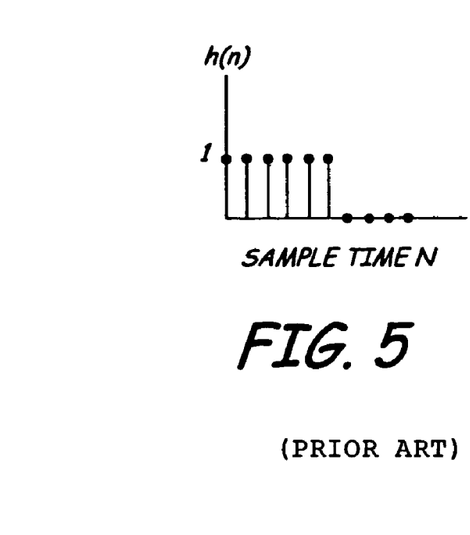
FIG. 5 show the impulse response of the serial boxcar filter of FIG. 4.

A final sample rate can be obtained by applying the conventional serial boxcar filter 37 with any desired decimation ratio 41 after the PISO conversion 35 as shown in the example of FIG. 2 with decimation by seven.

Figure 7:
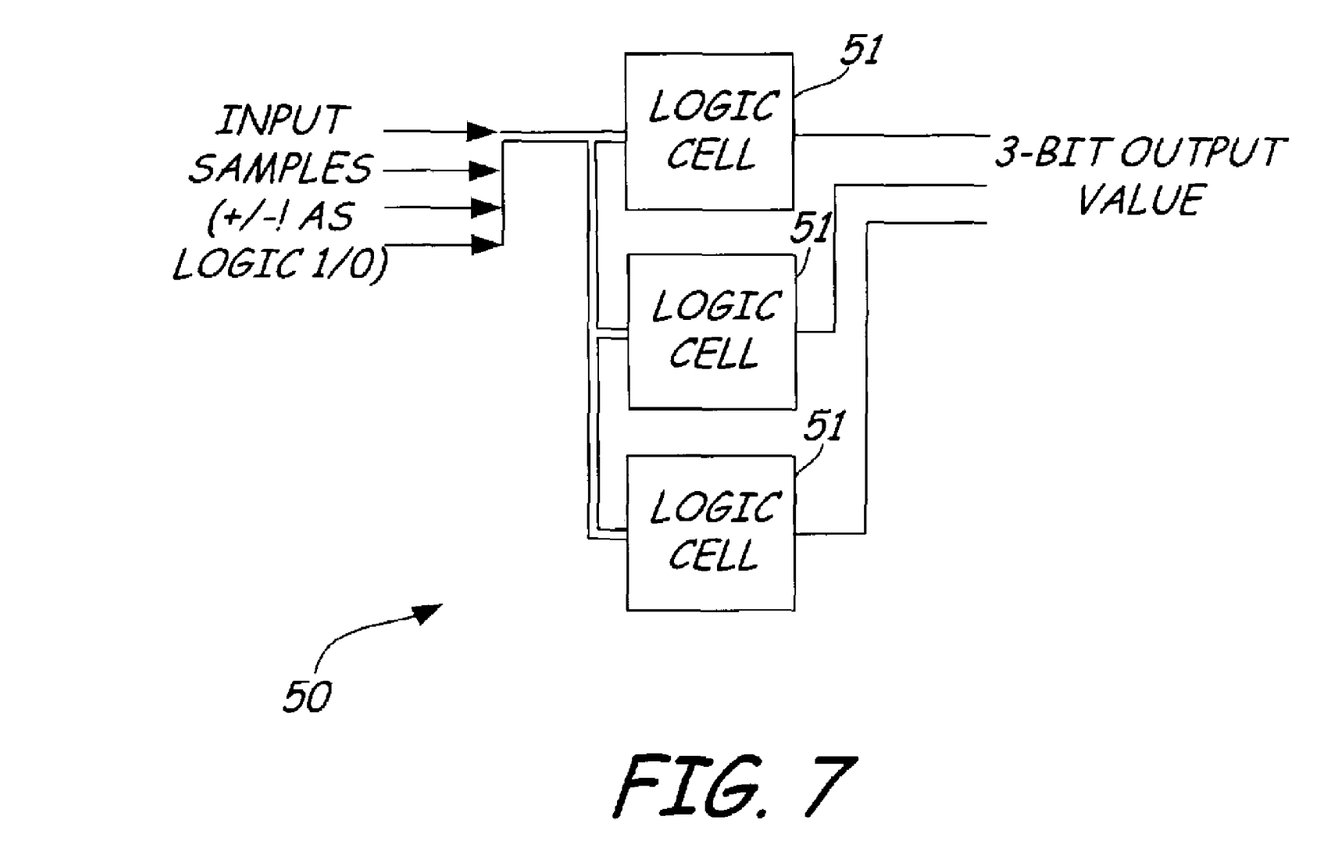
FIG. 7 shows a logic implementation of a filter and decimate-by-four function.
Figure 8:
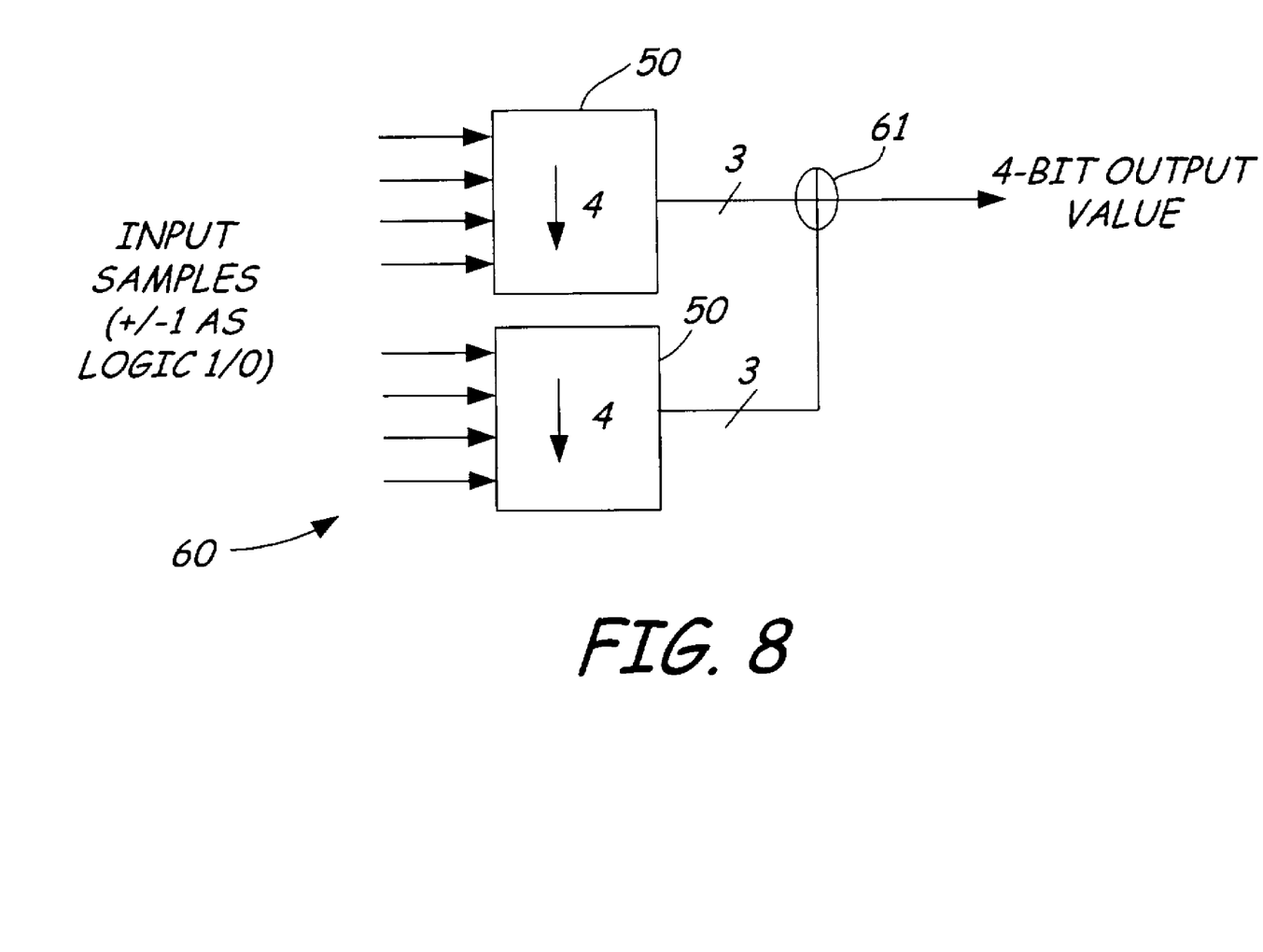
FIG. 8 shows a logic implementation of a filter and decimate-by-eight function.

Parallel boxcar decimation filters 31 and 32 are realized in conjunction with the DQM function 25 as shown in FIG. 3. With inputs samples to the parallel boxcar decimation filters 31 and 32 having only values of +1 (logic 1) and −1 (logic 0), a summation 39 in the conventional boxcar filter 37 in FIG. 4 becomes a simple count of the number of one bits, which is the Hamming weight function. The decimation boxcar filter output is modified by subtracting half the number of samples summed in order to produce a signed two's complement output. If, for example as shown in FIG. 7 and Table 2, four samples are summed, values from zero to four are obtained. This requires a three-bit number to represent all the possibilities. A value of two is subtracted to map into the range −2 . . . +2. Mapping of the result into two's complement format allows for conventional signal processing downstream.

Table 1 shows logic functions in implementing boxcar decimation filters 31 and 32. To decimate-by-two in the boxcar decimation filters 31 and 32, two single-bit functions of two input bits are needed as shown in Table 1.

TABLE 1

Logic Table for Filter and Decimate-by-Two Function

| Input Bits | 1 Bits | Decimal Output | 2's Complement Output |
| --- | --- | --- | --- |
| 11 | 2 | 1 | 01 |
| 01, 10 | 1 | 0 | 00 |
| 00 | 0 | −1 | 11 |

Figure 6:
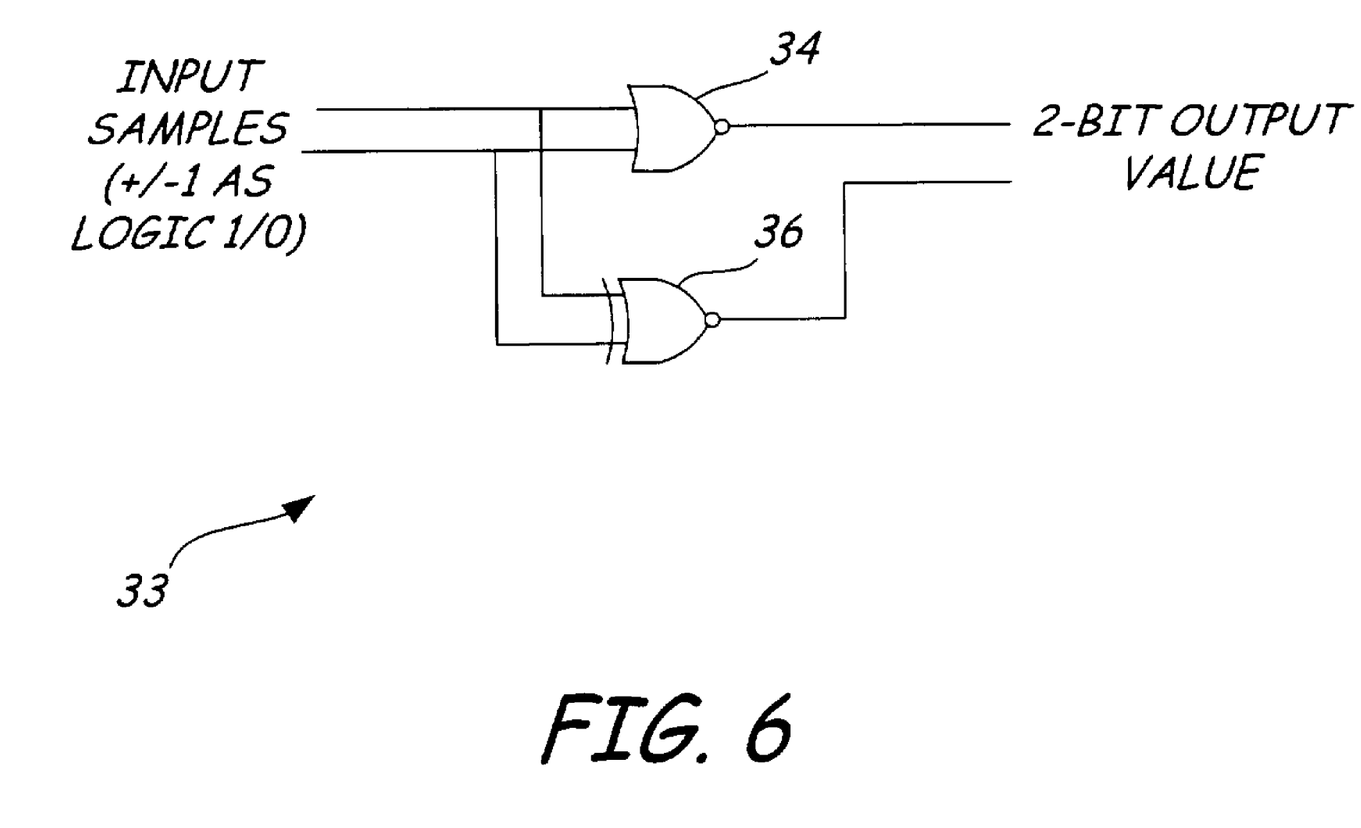
FIG. 6 shows a logic implementation of a filter and decimate-by-two function of the present invention.

The logic in Table 1 reduces to very simple logic functions 33 in FIG. 6 used to implement the filter and decimate-by-two functions 31 and 32. The logic function 33 includes a two-input NOR gate 34 and a two-input exclusive NOR gate 36 with their inputs connected together and each input connected to two of the Iout or two of the Qout 1-bit output values from the DQM 25. The processing for one 16-bit input transfer in parallel from the DQM function 25 uses four copies of the filter and decimate-by-two function 33 shown in FIG. 6 for I and four copies of the filter and decimate-by-two function 33 for Q to implement boxcar decimation filters 31 and 32. The inverters shown as part of the Fs/4 mix and decimate-by-two shown in FIG. 3 may be incorporated in the filter and decimate-by-two 33.

A filter and decimate-by-four function 50 is shown in FIG. 7 that may be used in place of the filter and decimate-by-two function 33 of FIG. 6. The filter and decimate-by-four function 50 may be used for the parallel boxcar decimation filters 31 and 32 of FIG. 2 when decimation by four is required. Four inputs from the DQM 25 are provided to each filter and decimate-by-four function 50. Four filter and decimate-by-four functions 50 are required to implement the parallel boxcar decimation filters 31 and 32. Each filter and decimate-by-four function 50 provides three output bits. Thus there are three logic cells 51 of four input bits each. Table 2 is a logic table for the filter and decimate-by-four function 50. Each logic cell 51 contains ordinary logic functions to generate the right hand column of Table 2 of a three-bit two's complement output from the four input bits provided. Two of the functions are very similar, which might allow some reduction in hardware. The inverters shown as part of the Fs/4 mix and decimate-by-two in FIG. 3 may be incorporated in this decimator also as shown by the column labeled Input Bits Absorbing Inversions in Table 2. Alternatively, the decimation-by-four 50 may be built as the sum of two decimate-by-two blocks 33 at the expense of additional hardware.

TABLE 2

Logic Table for Filter and Decimate-by-4 Function

| Input Bits | Input Bits Absorbing Inversions | 1 Bits | Decimal Output | 2's Complement Output |
| --- | --- | --- | --- | --- |
| 1111 | 1010 | 4 | +2 | 010 |
| 0111, 1011, 1101, 1110 | 0010, 1110, 1000, 1011 | 3 | +1 | 001 |
| 0011, 0101, 1001, 0110, 1010, 1100 | 0110, 0000, 1100, 0011, 1111, 1001 | 2 | 0 | 000 |
| 0001, 0010, 0100, 1000 | 0100, 0111, 0001, 1101 | 1 | −1 | 111 |
| 0000 | 0101 | 0 | −2 | 110 |

For filter and decimation-by-eight, a logic table similar to Table 2 is generated but has nine possible output values (four-bit number) and 256 combinations to be mapped. Implementing the entire decimation-by-eight as a combinational logic truth table is quite complicated and gains little savings. A hardware implementation of the decimate-by-eight function 60, shown in FIG. 8, has two copies of the decimate-by-four function 50 with their outputs combined in a three-in four-out adder 61. If desired, the hardware for one decimate-by-four function 50 may be used four times to do the halves of I and of Q.

It is believed that the efficient method and apparatus for high-speed single-bit complex sampling of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus for efficiently performing parallel processing of high-speed single-bit samples comprising:

a single-bit sampler for converting an analog signal into serial single-bit samples;

a serial-to-parallel converter for converting the single-bit samples from the single-bit sampler into parallel single-bit samples; and a digital quadrature mix for performing real-to-complex conversion, filtering, and decimation-by-two of the parallel single-bit samples from the serial-to-parallel converter and for providing parallel in-phase (I) and quadrature (Q) output values;

a filter and decimate stage to filter and decimate the parallel I and Q single-bit output values, wherein said filter and decimate stage comprises a boxcar decimation filter comprising a plurality of filter and decimate functions, wherein each of said plurality of filter and decimate functions comprise:

a NOR gate having two inputs connected to outputs of said digital quadrature mix; and an exclusive NOR gate having two inputs connected to the two inputs of the NOR gate.

2. The apparatus for efficiently performing parallel processing of high-speed single-bit samples of claim 1 wherein said digital quadrature mix performs an Fs/4 mix wherein Fs is the sample rate.

3. The apparatus for efficiently performing parallel processing of high-speed single-bit samples of claim 2 wherein said digital quadrature mix comprises logic operations that route and invert the parallel single-bit samples resulting in the parallel I and Q single-bit output values.

4. Apparatus for efficient parallel processing for use with a single-bit sampler that provides single-bit samples at a high sample rate comprising:

a serial-to-parallel converter for converting the single-bit samples into parallel single-bit samples; and a digital quadrature mix for performing an Fs/4 frequency shift to the parallel single-bit samples and simultaneously performing real-to-complex conversion of the parallel single-bit samples from the serial-to-parallel converter to provide parallel in-phase (I) and quadrature (Q) output values at an Fs/4 intermediate frequency (IF);

a filter and decimate stage to filter and decimate the parallel I and Q single-bit output values, wherein said filter and decimate stage comprises a boxcar decimation filter comprising a plurality of filter and decimate functions, wherein each of said plurality of filter and decimate functions decimate-by-two and comprise:

a NOR gate having two inputs connected to outputs of said digital quadrature mix; and an exclusive NOR gate having two inputs connected to the two inputs of the NOR gate.

5. The apparatus for efficient parallel processing for use with a single-bit sampler that provides single-bit samples at a high sample rate of claim 4 wherein the serial-to-parallel converter comprises shift register stages that provide a memory for use in functional realization of a boxcar filter and decimation stage in the digital quadrature mix.

6. The apparatus for efficient parallel processing for use with a single-bit sampler that provides single-bit samples at a high sample rate of claim 4 wherein said digital quadrature mix comprises logic operations that route and invert the parallel single-bit samples resulting in the parallel I and Q single-bit output values.

7. The apparatus for efficient parallel processing for use with a single-bit sampler that provides single-bit samples at a high sample rate of claim 4 wherein each of said plurality of filter and decimate functions decimate-by-four and comprise logic cells that form a two's complement three-bit output from four input bits.

8. The apparatus for efficient parallel processing for use with a single-bit sampler that provides single-bit samples at a high sample rate of claim 4 wherein each of said plurality of filter and decimate functions decimate-by-eight and comprise two decimate-by-four functions with the outputs of said decimate-by-four functions combined in a three-in four-out adder.

* * * * *